United States Patent
Reynolds

(10) Patent No.: US 7,035,616 B2
(45) Date of Patent: Apr. 25, 2006

(54) TWO-STAGE VARIABLE-GAIN MIXER EMPLOYING SHUNT FEEDBACK

(75) Inventor: Scott K. Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 848 days.

(21) Appl. No.: 10/039,247

(22) Filed: Jan. 4, 2002

(65) Prior Publication Data

US 2003/0130006 A1  Jul. 10, 2003

(51) Int. Cl.
H04B 1/26 (2006.01)

(52) U.S. Cl. .................. 455/326; 455/323; 455/313; 330/301

(58) Field of Classification Search ............. 455/326, 455/323, 313, 324, 337, 205, 334, 341; 375/340, 375/345; 329/315, 318, 319, 336; 330/301, 330/116; 333/25
See application file for complete search history.

(56) References Cited

U.S. PATENT DOCUMENTS

| | | | |
|---|---|---|---|
| 4,485,359 A | 11/1984 | Talbot et al. | |
| 5,497,123 A | 3/1996 | Main et al. | |
| 5,548,840 A | 8/1996 | Heck | |
| 5,886,547 A | 3/1999 | Durec et al. | |
| 6,057,714 A * | 5/2000 | Andrys et al. | 327/105 |
| 6,088,581 A * | 7/2000 | Bickley et al. | 455/131 |
| 6,147,559 A * | 11/2000 | Fong | 330/311 |
| 6,252,460 B1 * | 6/2001 | Ito | 330/301 |
| 6,369,658 B1 * | 4/2002 | Nilson | 330/301 |
| 6,704,559 B1 * | 3/2004 | Hageraats | 455/326 |
| 2002/0187768 A1 * | 12/2002 | Lin | 455/318 |

OTHER PUBLICATIONS

Barrie Gilbert, The Micromixer: A Highly Linear Variant of the Gilbert Mixer Using a Bisymmetric Class-AB Input Stage, Sep. 1997, p. 1412-1423, vol. 32 No. 9, IEEE JSSC. USA.
Chris Trask, A New Low-IMD Mixer, Sep. 2000, pp. 680-685, vol. 106 No. 1773, Electronics World, USA.

* cited by examiner

Primary Examiner—Quochien B. Vuong
Assistant Examiner—Lewis West
(74) Attorney, Agent, or Firm—Ference & Associates

(57) ABSTRACT

A demodulator which includes an active balun circuit and at least one mixer driven by the active balun circuit. The active balun circuit includes a negative shunt feedback arrangement.

15 Claims, 4 Drawing Sheets

TWO-STAGE VARIABLE-GAIN MIXER EMPLOYING SHUNT FEEDBACK

FIELD OF THE INVENTION

The present invention relates, generally, to mixers and demodulators in various radio architectures.

BACKGROUND OF THE INVENTION

In direct-conversion or low-intermediate-frequency radio architectures, such as are commonly used for Wideband Code Division Multiplex Access (WCDMA) band and multi-band cellular telephones, stringent requirements are placed on linearity in the receive signal path. Specifically, the receive signal path should desirably generate very low second-order and third-order intermodulation products while still achieving low noise figure and consuming low power. High linearity, low noise, and low power are conflicting design requirements, and it is difficult to simultaneously achieve all three objectives.

Numerous conventional efforts deal with the issue of mixer linearity, because it is such an important issue in radio design. The use of emitter degeneration is common. Two-stage designs are also commonly used to achieve a better tradeoff between noise and distortion. Significant prior efforts are described in the following patents and publications: U.S. Pat. No. 4,485,359 to Talbot et. al. (Nov. 27, 1984), "Amplitude Modulator Having Substantially Zero Modulation Distortion"; U.S. Pat. No. 5,548,840 to Heck (Aug. 20, 1996), "Balanced Mixer Circuit With Improved Linearity"; U.S. Pat. No. 5,497,123 to Main et. al. (Mar. 5, 1996), "Amplifier Circuit Having High Linearity For Cancelling Third Harmonic Distortion"; U.S. Pat. No. 5,886,547 to Durec et. al. (Mar. 23, 1999), "Circuit and Method of Controlling Mixer Linearity"; B. Gilbert, "The Micromixer: A Highly Linear Variant of the Gilbert Mixer Using a Bisymmetric Class-AB Input Stage", IEEE JSSC, Vol. 32, No. 9, September 1997, p. 1412, Analog Devices; and C. Trask, "A New Low-IMD Mixer", Electronics World, Vol. 106, No. 1773, September 2000, p. 680.

The patents to Talbot et al. and Heck both involve the application of series feedback to improve the linearity of an emitter degenerated double-balanced mixer. The feedback circuits disclosed in both patents s do not provide a controlled impedance single-ended input. In fact, the circuits in these patents would appear to increase the input impedance.

The patents to Main et al. and Durec et al., as well as the Gilbert article, involve the application of series feedback to an unusual bisymmetric, folded common-base input stage. The primary disadvantage of these circuits is high noise figure, and there is also no easy way to apply variable gain.

Trask appears to disclose the application of shunt feedback to a double-balanced mixer circuit. However, Trask applies shunt feedback from the mixer output back to the mixer input. Since the action of the mixer transforms the signal frequency, the feedback to the input is at a different frequency than the input signal.

In view of the foregoing, a need has been recognized in connection with overcoming the disadvantages and shortcomings presented by conventional efforts.

SUMMARY OF THE INVENTION

At least one presently preferred embodiment of the present invention broadly embraces a two-stage mixer or demodulator employing shunt feedback to linearize the first stage and having a provision for adjusting the gain of the second stage. This two-stage approach allows the linearity as characterized by the input second-order intercept point (IIP2) and input third-order intercept point (IIP3) to be increased without substantially increasing the noise figure (NF) or unduly increasing the power consumption. This two-stage mixer or demodulator could be included, for example, as part of the radio-frequency (RF) front end of a cellular telephone handset.

Among the unique features associated with at least one embodiment of the present invention is the manner in which shunt feedback is used to provide low second-order and third-order nonlinearities along with low noise and a controlled impedance single-ended input. The use of shunt feedback also indirectly enables the use of variable gain in the mixer by controlling input impedance.

In one aspect, the present invention provides a demodulator comprising: an input arrangement which accepts an input signal; an active balun circuit which amplifies the input signal and converts the input signal to differential form; at least one mixer; the active balun circuit being adapted to drive said at least one mixer; the active balun circuit comprising a negative shunt feedback arrangement.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
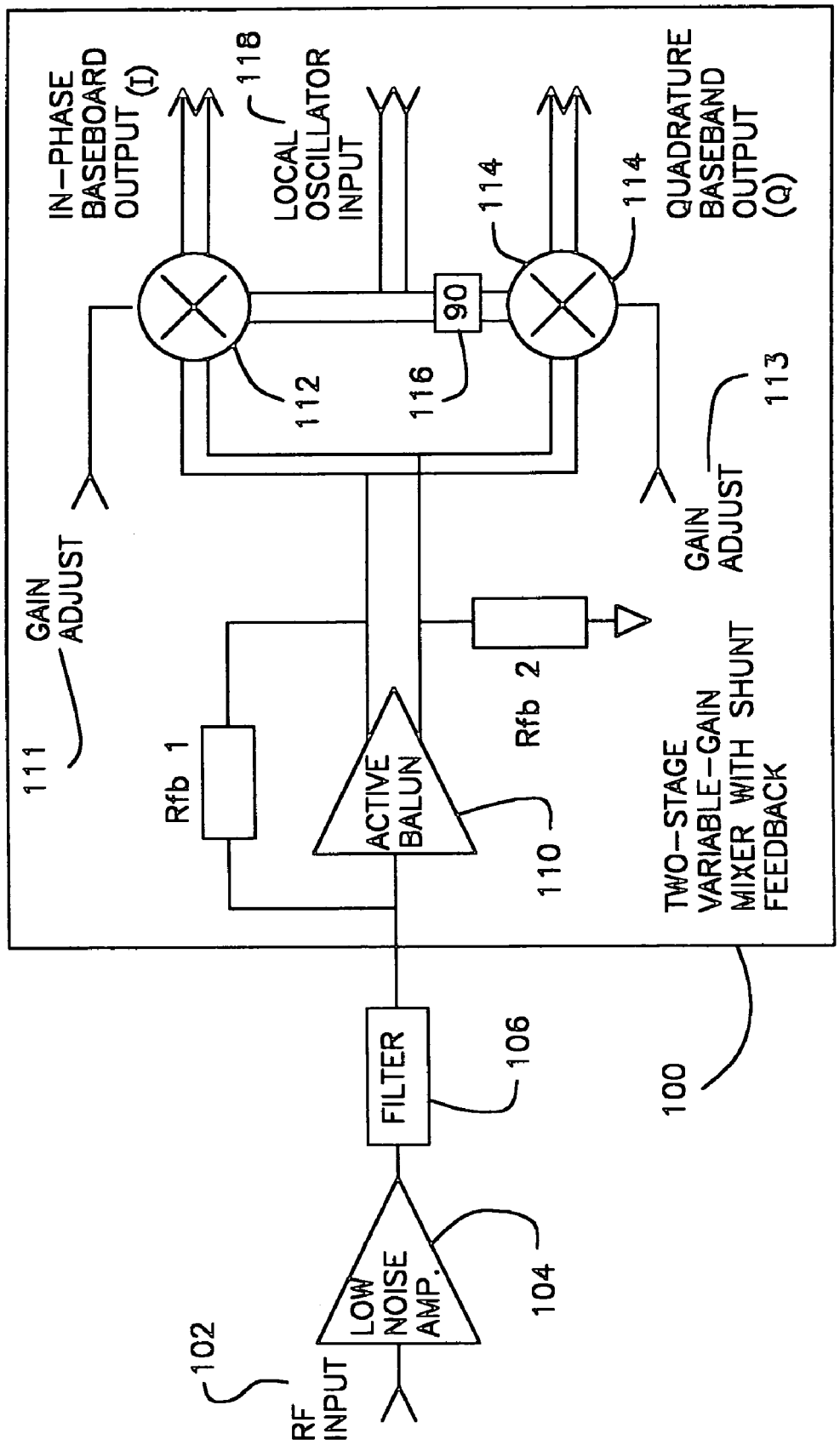
FIG. 1 is a schematic diagram of a two-stage demodulator.

A block diagram of a two-stage demodulator is shown in FIG. 1, as it would typically be used in the radio-frequency (RF) front end of a cellular telephone handset. The demodulator 100 preferably accepts a single-ended RF signal input 102 from a band-select filter 106, which may typically be an off-chip mechanical filter, such as a SAW filter. As a design requirement, the demodulator may preferably present a particular input impedance (50 ohms in the present example) as a load for the filter, in order that the filter performs properly; this may be accomplished by designing the active balun 110 to provide a stable 50 ohm input impedance over the frequency range of interest, and by designing Low Noise Amplifier 104 to have a stable 50 ohm output impedance over the frequency range of interest. Preferably, an active balun circuit 110 with negative shunt feedback (Rfb1 and Rfb2) both amplifies the signal and converts it to differential form. The differential RF signal from the active balun 110 is applied to two mixers 112, 114. Each mixer is also driven from a differential local oscillator (LO) signal 118, but one of the mixers, 114 has the local oscillator signal phase shifted by 90 degrees (at 116). The differential outputs of the two mixers 112, 114 are referred to as the in-phase (I) and quadrature (Q) baseband signals, respectively. This configuration of two mixers driven from the same RF input signal and driven by LO signals 90 degrees out of phase is variously referred to as a quadrature mixer, or a quadrature demodulator, or an image reject mixer, or an IQ demodulator, and would appear to be well-known to those of ordinary skill in the art.

Indicated at 111 and 113 are gain adjust inputs which switch the mixers 112 and 114, respectively, between two or more gain states, thus providing for and thus provides a mechanism to allow automatic gain control for the receiver.

This present invention, in accordance with at least one presently preferred embodiment, has among its features the particular form of shunt feedback used in the active balun 110, which lowers distortion while allowing the implementation of variable gain in the mixers without disrupting the constant (e.g., 50 ohm) input impedance of the overall demodulator. Furthermore, the circuitry which couples the active balun 110 to the mixers 112, 114 allows second-order intermodulation products from the active balun 110 to be sharply attenuated by filtering prior to the mixers 112, 114. The implementation of variable gain in the mixers 112, 114 also allows distortion to be reduced by dynamic gain adjustment at the system level.

Figure 2:
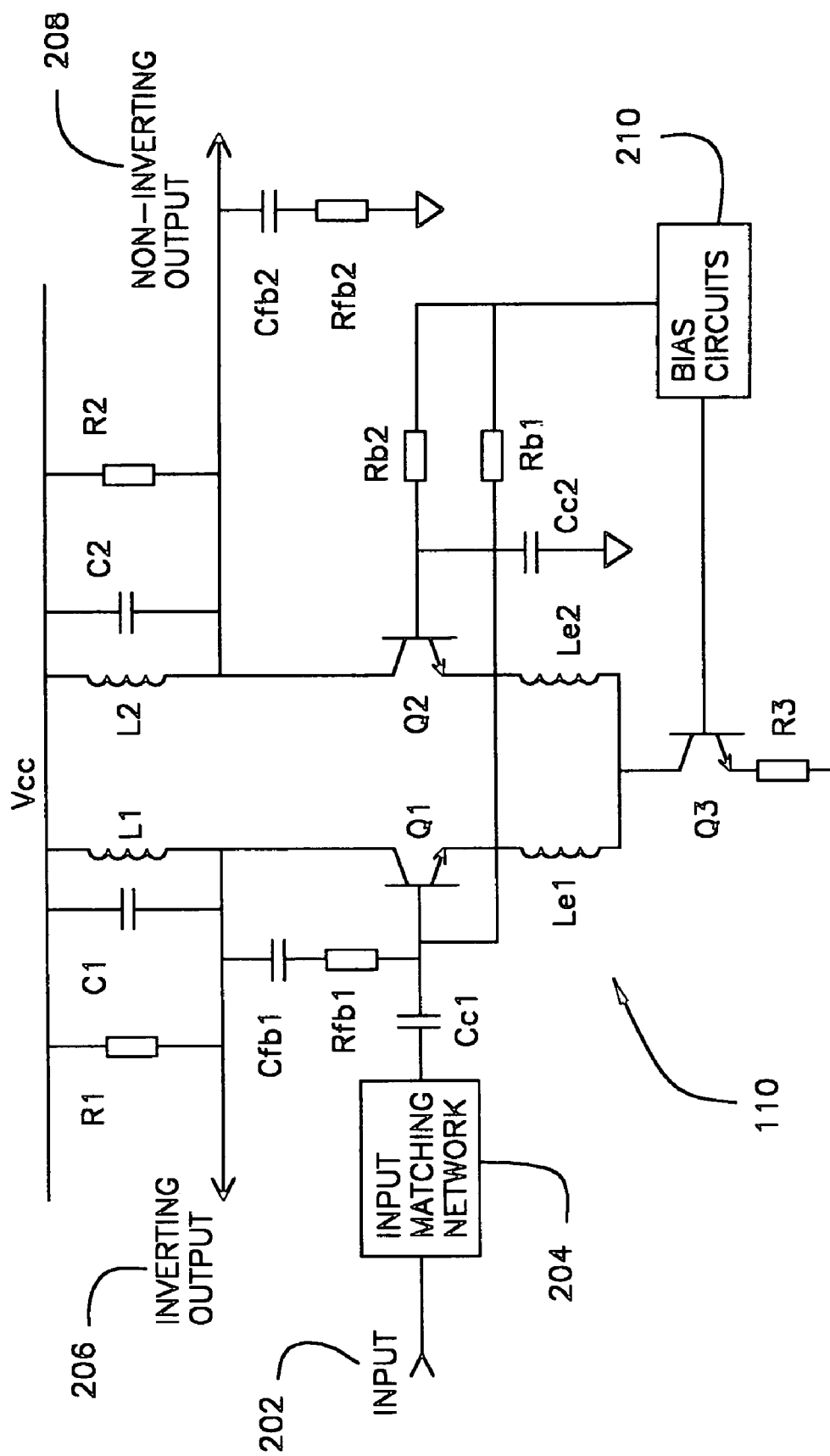
FIG. 2 is a schematic diagram of an active balun.

A schematic diagram of an active balun 110 in accordance with an embodiment of the present invention, including the shunt feedback resistors Rfb1 and Rfb2, is shown in FIG. 2. It is based on a conventional differential pair, with inductive emitter degeneration via Le1 and Le2. A tuned load (R1-C1-L1 and R2-C2-L2) is used to provide maximum gain at the frequency of interest.

Because the differential pair is driven from one input only (202), at microwave frequencies the inverting and non-inverting outputs (206, 208) are not symmetrical.

Indicated at 204 is an input matching network, which provides a stable, well-defined input impedance for the active balun over the frequency range of interest. In the present example, for instance, it may provide a 50 ohm input impedance over the frequency range of 2110 to 2170 MHz. It is important that (with reference to FIG. 1) the impedance thus presented to the SAW filter 106 not change significantly over temperature or manufacturing variations, or when the gain of the mixers 112/114 is changed. The negative shunt feedback in accordance with at least one embodiment of the present invention is advantageous in this regard.

The non-inverting output 208 has lower amplitude and lags in phase. Because of the asymmetrical drive signal, it would not normally be clear as to how a conventional negative feedback circuit can be applied. The asymmetrical shunt feedback in FIG. 2, however, helps to balance the inverting and non-inverting outputs 206, 208 in amplitude, by reducing the amplitude of the inverting output 208 more than that of the non-inverting output 206. The asymmetrical shunt feedback in FIG. 2 also helps to reduce the phase lag by increasing the effective bandwidth of the input transistor Q1. Although it provides no feedback, Rfb2 is included to provide approximately equal loading on the inverting and non-inverting outputs 206, 208.

Among other components shown in FIG. 2, Vcc is the power supply voltage. Cfb1, Cfb2, Cc1, and Cc2 are AC coupling capacitors; their function is to provide a low impedance path for the signal current flow while blocking the flow of direct current. Rb1 and Rb2 are biasing resistors; their function is to provide a DC bias to the bases of transistors Q1 and Q2 while providing a high impedance path to the AC signal. Q3 and R3 form a constant current source for proper DC biasing of transistors Q1 and Q2. The bias circuits indicated at 210 provide the voltages for correct DC biasing of transistors Q1 and Q2 over temperature and manufacturing variations.

In contrast to Trask, supra, in the circuit of FIG. 2, the shunt feedback is applied from the inverting output 206 of the active balun 110 back to the input 202, and the feedback to the input 202 is at the same frequency as the input signal.

In one implementation, as modeled in a computer simulation, it was found that third order intermodulation distortion of the circuit in FIG. 2 can be reduced about 5 dB by the application of negative feedback through Rfb1, with less than a 2 dB increase in noise figure. Thus, system dynamic range is increased by more than 3 dB.

Figure 3:
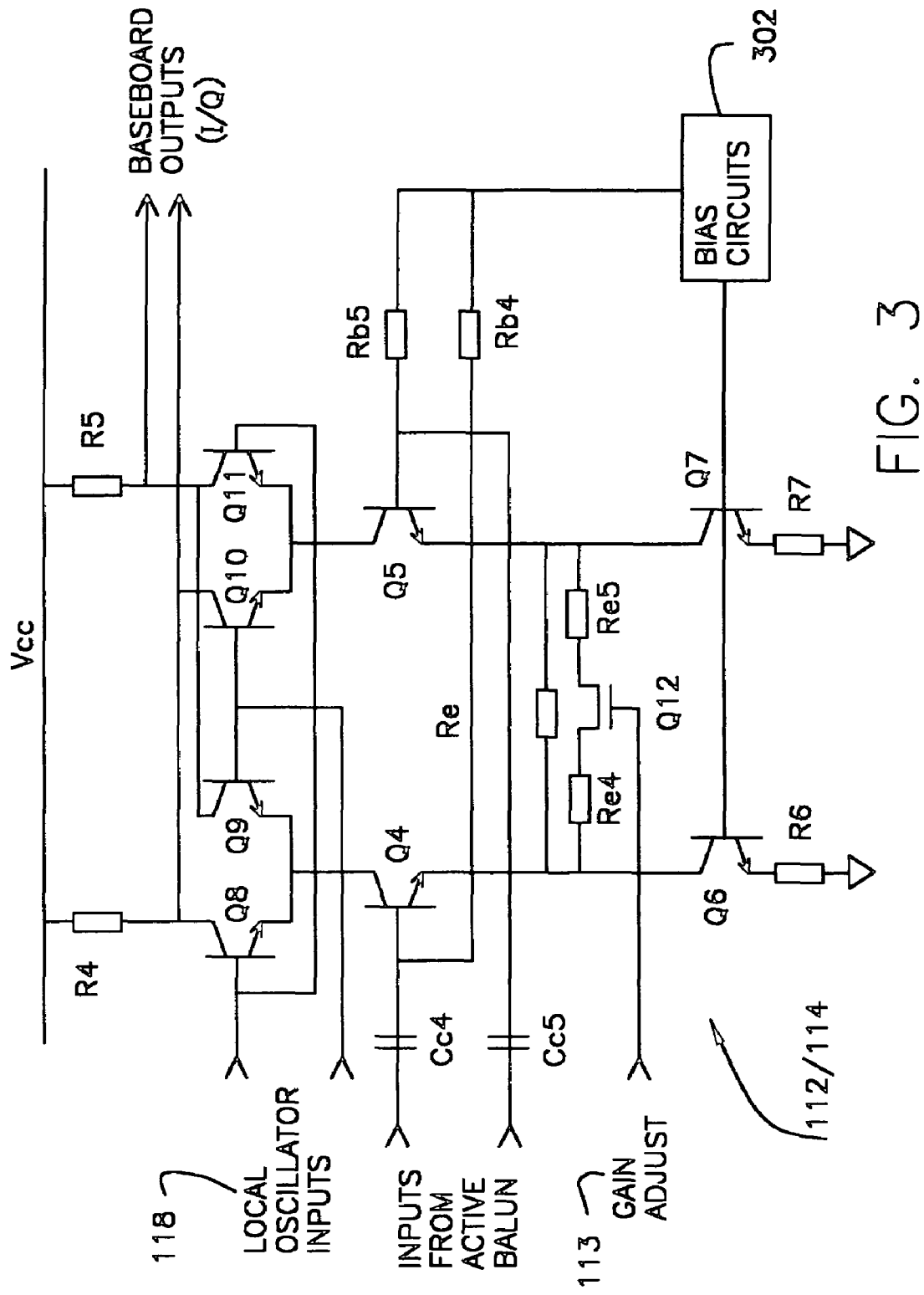
FIG. 3 is a schematic diagram of two mixers.

A schematic diagram of a mixer (112 or 114) from FIG. 1, in accordance with an embodiment of the present invention is shown in FIG. 3. Preferably, both mixers 112, 114 may have essentially the same structure, as shown in FIG. 3. A conventional double-balanced Gilbert cell multiplier is formed by Q8, Q9, Q10 and Q11, driven by the local oscillator inputs 118. The differential RF signal from the active balun is applied to a voltage-to-current converter formed by the resistively degenerated differential pair Q4–Q5.

A unique feature of a mixer such as that shown in FIG. 3 is the adjustable gain function provided by resistors Re4, Re5, and transistor Q12. Gain control is achieved by turning transistor Q12 on or off and thus varying the total amount of emitter degeneration for Q4 and Q5. Such adjustable degeneration is often applied in analog circuits, but it would not normally be applied in a microwave circuit because a variation in the emitter degeneration significantly changes the input impedance of the differential pair. Thus, the loading on the active balun changes, and the input impedance of the active balun changes in turn. This finally causes the loading on the SAW filter 106 in FIG. 1 to change, adversely impacting its frequency selectivity. In a circuit designed in accordance with at least one embodiment of the present invention, the negative shunt feedback employed in the active balun stabilizes the input impedance of the active balun sufficiently that the load seen by the SAW filter does not change significantly with the gain switching in the mixers.

Among other components shown in FIG. 3, Vcc is the power supply voltage. R4 and R5 are the mixer load resistors. Re is an emitter degeneration resistor which, together with Re4, Re5, and Q12, sets the gain of the mixer. Q6, Q7, R6, and R7 form constant current sources for DC biasing of the mixer. Rb4 and Rb5 are biasing resistors; their function is to provide a DC bias to the bases of transistors Q4 and Q5 while providing a high impedance path to the AC signal. The bias circuits 302 provide the voltages for correct DC biasing of transistors Q4 and Q5 over temperature and manufacturing variations.

In any active balun based on a differential pair, the asymmetrical input signal drive results in second-order nonlinearities (both intermodulation and harmonic distortion) which are undesired additions to the signal going to the mixer. Some of the second-order distortion products occur at low frequencies at or near DC, and in a direct conversion receiver they can corrupt the baseband signal. The shunt feedback applied in FIG. 2 reduces (but does not eliminate) these second-order nonlinearities. In addition, the load inductors L1 and L2 in FIG. 2 combined with coupling capacitors Cc4 and Cc5 in FIG. 3 form a second-order high-pass filter which sharply attenuates these second-order nonlinearities. Filtering is often used to remove distortion products, but the configuration in FIGS. 2 and 3 is particularly advantageous because it makes use of components that are already in the circuit for other reasons.

Figure 4:
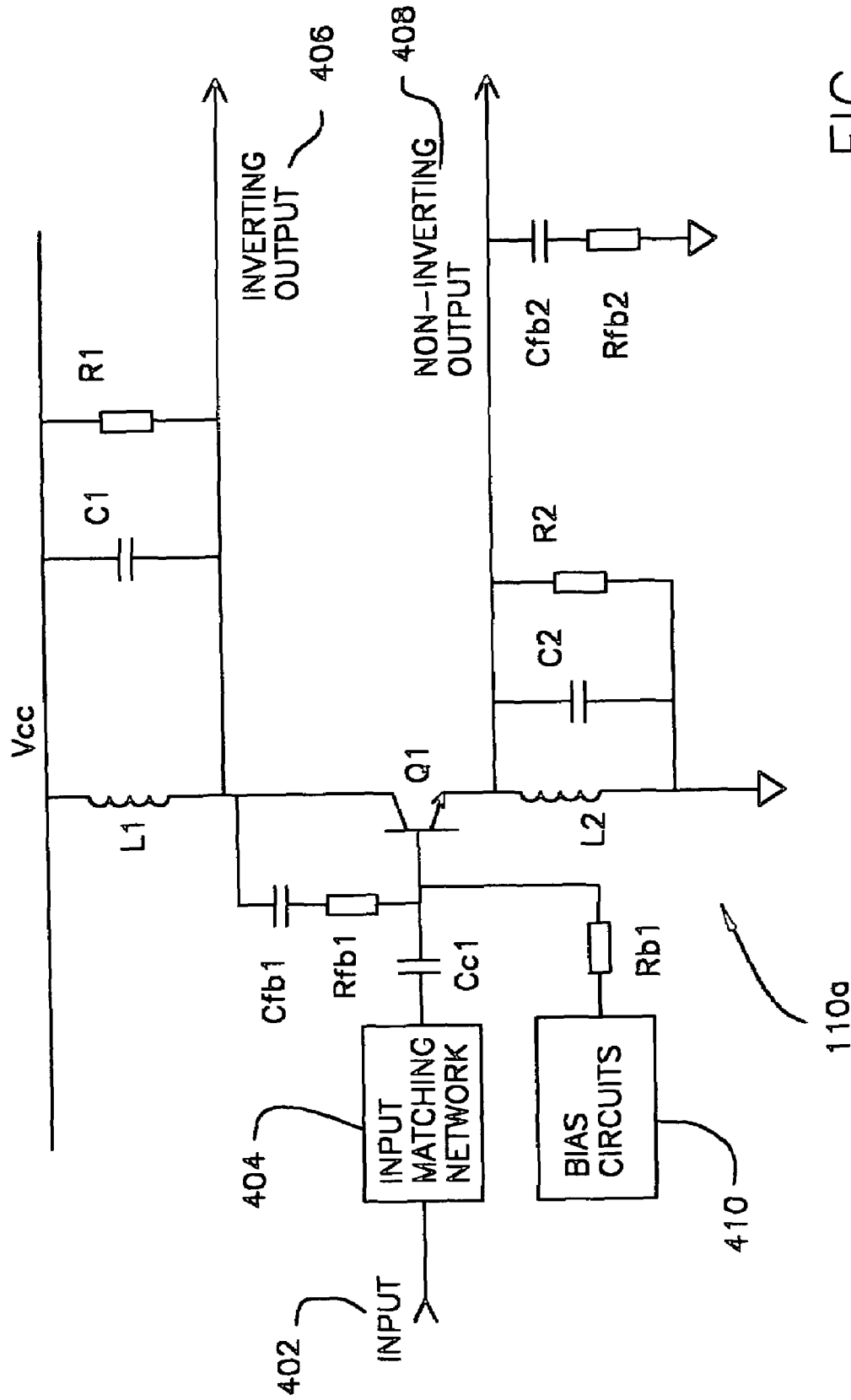
FIG. 4 is a schematic diagram of a different active balun.

FIG. 4 is a schematic diagram of a different active balun (110a) than that shown in FIG. 2, but which may employ negative shunt feedback in a similar manner. Similarly to the active balun shown in FIG. 2, that in FIG. 4 (110a) includes an input 402, input matching network 404, inverting and non-inverting outputs 406/408 and bias circuits 410. Similar circuit components as found in FIG. 2 are indicated with similar labels in FIG. 4. A notable difference between the circuit 110a shown in FIG. 4 and the circuit 110 shown in FIG. 2 is that the former has parallel components (L2-C2-R2) that are grounded instead of being connected to the power supply voltage (Vcc). However, it will be appreciated that the negative shunt feedback (essentially comprised of Rfb1 and Cfb1) performs essentially the same functions here as in the circuit 110 shown in FIG. 2, and thus offers the same advantages. In this vein, it should be appreciated that a negative shunt feedback arrangement, as broadly contemplated herein, may be applicable to any of a very wide range of active balun circuits and not just to those shown in FIGS. 2 and 4.

Though, in accordance with one embodiment of the present invention, bipolar transistors are shown in FIGS. 2 and 3, it should be understood that the same circuitry could be implemented with MOSFETs, JFETs, MESFETs, or vacuum tubes, with appropriate adjustments in supply voltage amplitude and polarity.

It will be appreciated from the foregoing that, in accordance with at least one presently preferred embodiment of the present invention, an active balun circuit includes a transistor and the negative shunt feedback arrangement connects between the collector and base of the transistor.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A demodulator comprising:
   an input arrangement which accepts an input signal;
   an active balun circuit which amplifies the input signal and converts the input signal to differential form;
   at least one mixer;
   said active balun circuit being adapted to drive said at least one mixer;
   said active balun circuit comprising an asymmetrical negative shunt feedback arrangement.

2. The demodulator according to claim 1, wherein said asymmetrical negative shunt feedback arrangement is adapted to apply variable gain in said at least one mixer.

3. The demodulator according to claim 1, wherein said asymmetrical negative shunt feedback arrangement is adapted to provide stabilized input impedance.

4. The demodulator according to claim 1, wherein said at least one mixer comprises two mixers, said two mixers being adapted to provide differential outputs.

5. The demodulator according to claim 1, wherein said asymmetrical negative shunt feedback arrangement comprises a resistor and a capacitor in series.

6. The demodulator according to claim 1, wherein said active balun circuit further comprises:
   a transistor;
   wherein said asymmetrical negative shunt feedback arrangement connects between the collector and base of said transistor.

7. The demodulator according to claim 1, wherein said active balun circuit further comprises:
   an inverting output;
   wherein said asymmetrical negative shunt feedback arrangement interconnects said input arrangement with said inverting output.

8. The demodulator according to claim 7, wherein said active balun circuit further comprises:
   a transistor;
   wherein said asymmetrical negative shunt feedback arrangement connects between the collector and base of said transistor in interconnecting said input arrangement with said inverting output.

9. The demodulator according to claim 7, wherein said active balun circuit further comprises:
   a non-inverting output; and
   a compensating arrangement adapted to ensure approximately equal loading on said inverting and non-inverting outputs.

10. The demodulator according to claim 9, wherein said compensating arrangement comprises an additional resistor and an additional capacitor in series, said additional resistor and additional capacitor in series being connected between said non-inverting input and ground.

11. The demodulator according to claim 7, wherein said active balun circuit further comprises:
    a non-inverting output;
    said negative shunt feedback arrangement being adapted to reduce the amplitude of said inverting output more than a reduction in the amplitude of said non-inverting output.

12. The demodulator according to claim 1, wherein said active balun circuit further comprises:
    an inverting output;
    a non-inverting output; and
    a first load tuning arrangement connected between said inverting output and power supply voltage; and
    a second load tuning arrangement connected between said non-inverting output and power supply voltage.

13. The demodulator according to claim 1, wherein said active balun circuit further comprises:
    an inverting output;
    a non-inverting output; and
    a first load tuning arrangement connected between said inverting output and power supply voltage; and
    a second load tuning arrangement connected between said non-inverting output and ground.

14. The demodulator according to claim 1, whereby overall distortion is reduced via said asymmetrical negative shunt feedback arrangement.

15. The demodulator according to claim 1, wherein said demodulator is adapted for incorporation into a radio-frequency front end of a cellular telephone handset.

* * * * *